(12) United States Patent
Park (10) Patent No.: US 9,006,848 B2
(45) Date of Patent: Apr. 14, 2015

(54) NONVOLATILE MAGNETIC MEMORY DEVICE

(71) Applicants: SK Hynix Inc., Icheon-si (KR); IUCF-HYU (Industry-University Cooperation Foundation Hanyang University), Seoul (KR)

(72) Inventor: Wan Jun Park, Seoul (KR)

(73) Assignees: SK Hynix Inc., Icheon (KR); Industry-University Cooperation Foundation Hanyang Univerity, Seoul (KR)

( * ) Notice: Subject to any disclaimer, the term of this patent is extended or adjusted under 35 U.S.C. 154(b) by 0 days.

(21) Appl. No.: 13/892,199

(22) Filed: May 10, 2013

(65) Prior Publication Data

US 2013/0334632 A1    Dec. 19, 2013

(30) Foreign Application Priority Data

Jun. 13, 2012 (KR) .................. 10-2012-0063366

(51) Int. Cl.
*H01L 29/82* (2006.01)
*H01L 27/22* (2006.01)
*H01L 43/08* (2006.01)
*H01L 43/10* (2006.01)

(52) U.S. Cl.
CPC .............. *H01L 27/224* (2013.01); *H01L 43/08* (2013.01); *H01L 43/10* (2013.01); *H01L 27/228* (2013.01)

(58) Field of Classification Search
USPC .......................... 257/421, 422, E21.665, 108
See application file for complete search history.

(56) References Cited

U.S. PATENT DOCUMENTS

| | | | |
|---|---|---|---|
| 2009/0073737 A1* | 3/2009 | Klostermann et al. .......... 365/53 |
| 2009/0161267 A1* | 6/2009 | Kawai et al. ................ 360/324.2 |
| 2012/0081950 A1* | 4/2012 | Slaughter ...................... 365/158 |
| 2013/0082339 A1* | 4/2013 | Aggarwal et al. ............. 257/421 |

FOREIGN PATENT DOCUMENTS

| | | |
|---|---|---|
| JP | 2008-135432 A | 6/2008 |
| JP | 2010-067643 A | 3/2010 |
| KR | 10-2001-0021255 A | 3/2001 |
| KR | 10-2002-0055448 A | 7/2002 |

OTHER PUBLICATIONS

Joon Pyo Kil et al., "Perpendicular Magnetization of CoZr/Pt Multilayers", Journal of the Korean Physical Society, May 2012, pp. 1690-1694, vol. 60, No. 10.

* cited by examiner

*Primary Examiner* — Timor Karimy (57) ABSTRACT

A nonvolatile magnetic memory device using a magnetic tunneling junction (MTJ) uses as a data storage unit an MTJ including a pinned magnetic layer, a nonmagnetic insulating layer, and a free magnetic layer which are sequentially stacked. The free magnetic layer includes at least one soft magnetic amorphous alloy layer in which zirconium (Zr) is added to a soft magnetic material formed of cobalt (Co) or a Co-based alloy.

18 Claims, 10 Drawing Sheets

NONVOLATILE MAGNETIC MEMORY DEVICE

CROSS-REFERENCES TO RELATED APPLICATION

This application claims the benefit of Korean Patent Application No. 10-2012-0063366, filed on Jun. 13, 2012, in the Korean Intellectual Property Office, the disclosure of which is incorporated herein in its entirety by reference.

BACKGROUND OF THE INVENTION

1. Field of the Invention

The present disclosure relates to a nonvolatile magnetic memory device, and more particularly, to a nonvolatile magnetic memory device including a magnetic tunnel junction (MTJ).

2. Description of the Related Art

Examples of a nonvolatile memory device include a phase-change random access memory (PRAM), a magnetoresistive RAM (MRAM), a ferroelectric RAM (FRAM), and a resistive RAM (ReRAM). Among these nonvolatile memory devices, the MRAM is a solid-state magnetic memory device using a giant magnetoresistance effect or a tunneling magnetoresistance effect based on a spin-dependent conductivity of a nano magnetic material. The MRAM has recently attracted attention because of its higher speed and greater durability, even after repeated use, than other nonvolatile memory devices.

A magnetic tunnel junction (MTJ) is a storage node structure of an MRAM. The MTJ structure, in which one insulating layer is inserted between two magnetic thin films, may be coupled to a conventional complementary metal oxide semiconductor (CMOS) architecture.

A magnetic field writing (MFW) method and a current-induced magnetization switching (CIMS) method may be used to write data in cells of an MRAM having the MTJ structure. Using these methods, the cells of the MRAM may store information in an in-plane magnetization (IPM) manner or a magnetization-perpendicular-to-a-plane (MPP) manner.

IPM has a disadvantage in that it is difficult to scale down a size of the MRAM, due to sensitivity to an anisotropic shape and an edge effect, which increase as the area of the MTJ decreases. In contrast, MPP has an advantage over IPM in terms of scaling down the MRAM, since MPP reduces switching abnormalities related to the edge effect.

The MTJ using MPP may exhibit magnetoresistance switching behavior due to bulk anisotropy or interface anisotropy of a magnetic thin film. In general, bulk anisotropy requires a high level of writing current for field switching or spin transfer torque. Moreover, since a high degree of crystallinity of the magnetic thin film is necessary to achieve bulk anisotropy, high manufacturing temperatures equal to or higher than 500° C. are required.

Accordingly, it is advantageous to use MPP using the interface anisotropy for low-current switching and fabrication at a lower temperature equal to or lower than 300° C. However, due to a low magnetization crystalline anisotropy ($K_u$), MPP that uses the interface anisotropy has poor thermal stability, which adversely affects data retention capabilities of the MRAM.

CoFeB has been suggested as a new material suitable for an MPP-MTJ method (see "A perpendicular-anisotropy CoFeB—MgO magnetic tunnel junction", S. Ikeda, etc., Nature Materials, Volume 9, Pages 721 to 724 (2010)). However, since the addition of boron reduces spin polarization, loss of a magnetoresistance in CoFeB may be greater than in other materials such as Co, CoFe, or NiFe having a crystalline structure.

SUMMARY OF THE INVENTION

Embodiments of the present disclosure are directed to a nonvolatile magnetic memory device having a high tunneling magnetoresistance, which may be obtained by reducing magnetoresistance loss. Embodiments of the present disclosure are also directed to a nonvolatile magnetic memory device having magnetization perpendicular to a plane (MPP) characteristics and improved thermal stability.

According to an aspect of the present invention, a nonvolatile magnetic memory device comprising a magnetic tunneling junction (MTJ) is provided. The MTJ includes a pinned magnetic layer, a nonmagnetic insulating layer, and a free magnetic layer. The free magnetic layer may include zirconium (Zr), and a soft magnetic amorphous material such as cobalt (Co) and a Co-based alloy. The free magnetic layer also may include at least one soft magnetic amorphous alloy layer in which zirconium (Zr) is added to the soft magnetic material.

The free magnetic layer may include at least one of CoZr, CoFeZr, and a combination thereof. A Zr content in the free magnetic layer may range from about 5 atomic % to about 40 atomic %.

The free magnetic layer may have MPP characteristics when the free magnetic layer has a thickness less than a critical thickness. The free magnetic layer may have in-plane magnetization (IPM) characteristics when the free magnetic layer has a thickness exceeding the critical thickness. The critical thickness ranges from about 0.5 nm to about 1.5 nm.

The nonvolatile magnetic memory device may further include a nonmagnetic insulating layer and a pinned magnetic layer, which are stacked on the free magnetic layer. In this case, the nonvolatile magnetic memory device has a symmetric MTJ structure with respect to the free magnetic layer. The MTJ may further include a nonmagnetic metal layer that is disposed between the nonmagnetic insulating layer and the free magnetic layer. The nonmagnetic metal layer may include rhodium (Rh), hafnium (Hf), palladium (Pd), platinum (Pt), tantalum (Ta), osmium (Os), germanium (Ge), iridium (Ir), gold (Au), silver (Ag), or an alloy thereof. A ratio of a thickness of the free magnetic layer to a thickness of the nonmagnetic metal layer may range from about 0.3 to about 1. Alternatively, the MTJ may have a multi-layer structure in which a plurality of two-part layers are repeatedly stacked several times on the nonmagnetic insulating layer, where each of the two-part layers includes the free magnetic layer and the nonmagnetic metal layer.

The nonvolatile magnetic memory device may further include a switching device that is connected to the MTJ. The switching device may be configured to select a cell of the nonvolatile magnetic memory device. For instance, the switching device may include a diode or a transistor.

BRIEF DESCRIPTION OF THE DRAWINGS

Hereinafter, embodiments of the present disclosure will be described in greater detail with reference to the accompanying drawings.

DETAILED DESCRIPTION OF THE INVENTION

Embodiments of the present disclosure will now be described more fully with reference to the accompanying drawings.

The invention may, however, be embodied in many different forms and should not be construed as being limited to the embodiments set forth herein; rather these embodiments are provided so that this disclosure will be thorough and complete, and will fully convey the concept of the invention to one of ordinary skill in the art. The terminology used herein is for the purpose of describing particular embodiments and is not intended to be limiting.

Also, thicknesses or sizes of layers in the drawings may be exaggerated for convenience of explanation and clarity, and the same reference numerals refer to the same or like parts in the drawings. As used herein, the term "and/or" includes any and all combinations of one or more of the associated listed items.

The terminology used herein is for the purpose of describing particular embodiments and is not intended to be limiting. As used herein, the singular forms "a," "an" and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of embodiments disclosed herein.

It will be understood that when a layer is referred to as being "formed on," another layer, it can be directly formed on the other layer or intervening layers may be present therebetween. Likewise, when a material is referred to as being adjacent to another material, intervening materials may be present therebetween. In contrast, when a layer or material is referred to as being "directly" formed on, to another layer or material or as being "directly" adjacent to or contacting another layer or material, there are no intervening materials or layers therebetween.

The present invention will now be described more fully with reference to the accompanying drawings, in which embodiments of the invention are shown. In the drawings, for example, sizes and shapes of members may be exaggerated for clarity and convenience of explanation. Accordingly, the shapes may be modified, and should not be construed as being limited to specific shapes of regions.

The term "substrate" used herein includes a supporting structure such as silicon, silicon-on-insulator (SOI), or silicon-on-semiconductor (SOS), a semiconductor layer formed on a supporting structure other than a semiconductor, a doped or undoped semiconductor layer, and a modified semiconductor layer. Also, the terms "supporting structure" and "semiconductor" are not limited to a silicon-based material and collectively refer to carbon, a polymer, silicon-germanium, germanium, a group III-V semiconductor material such as a gallium-arsenic-based compound, a group II-VI semiconductor material, or a mixed semiconductor material.

The term "stoichiometry" refers to a quantitative relationship between atoms of two materials in a phase-change material film having a predetermined volume. For example, a stoichiometry may be measured by using, for example, Rutherford backscattering spectrometry (RBS), energy dispersive X-ray spectroscopy, or the like.

Figure 1A:
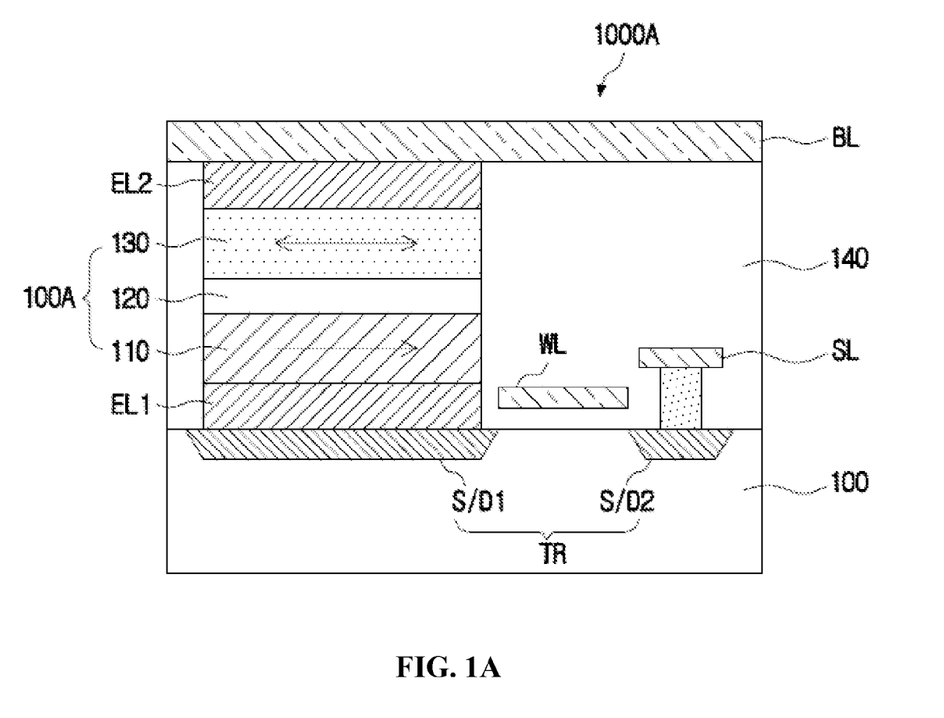
FIG. 1A is a cross-sectional view illustrating a nonvolatile memory device including an in-plane magnetization (IPM) magnetic tunneling junction (MTJ) according to an embodiment of the present disclosure.
Figure 1B:
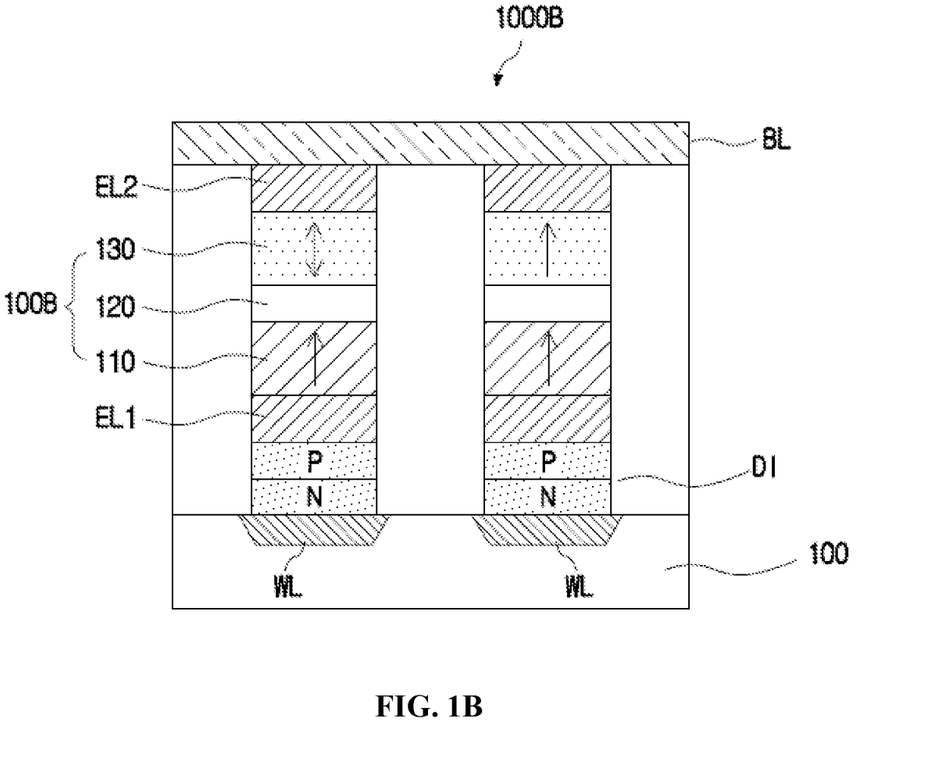
FIG. 1B is a cross-sectional view illustrating a nonvolatile memory device including a magnetization-perpendicular-to-a-plane (MPP) MTJ according to another embodiment of the present disclosure.

FIG. 1A is a cross-sectional view illustrating a nonvolatile memory device 1000A including an in-plane magnetization (IPM) magnetic tunneling junction (MTJ) according to an embodiment of the present disclosure. FIG. 1B is a cross-sectional view illustrating a nonvolatile memory device 1000B including a magnetization-perpendicular-to-a-plane (MPP) MTJ according to another embodiment of the present disclosure. FIGS. 1A and 1B illustrate a portion of a cell array region.

Referring to FIGS. 1A and 1B, the magnetic memory devices 1000A and 1000B may include the MTJs 100A and 100B as storage nodes, respectively. In order to select a cell in the magnetic memory device, the MTJs 100A and 100B may be coupled to switching devices such as a transistor TR or a diode DI disposed on a substrate 100.

In FIG. 1A, one end of the MTJ 100A included in a memory cell is connected to a first wiring, for example, a bit line BL, through a second electrode EL2. The other end of the MTJ 100A is connected to a first source/drain S/D1 of the transistor TR through a first electrode EL1. A second source/drain S/D2 of the transistor TR is coupled to a source line SL, and a gate G of the transistor TR is coupled to a second wiring, for example, a word line WL, in order to receive an enable signal. Since the memory cell shown in FIG. 1A has a 1 transistor-1 MTJ structure, a cell area may be reduced to 8F².

In the transistor TR of FIG. 1A, design parameters may be appropriately determined to address phenomena, such as a short channel effect and a leakage current, that may occur as the degree of integration increases. For example, such design parameters may include the shape of a channel (e.g., a planar shape or a trench shape), the shape of impurity regions (e.g., the first source/drain S/D1 or the second source/drain S/D2), or an impurity concentration of the impurity regions.

In an embodiment, a switching device coupled to the MTJs 100A and 100B may include two or more transistors that perform a non-destructive reading operation. Alternatively, a non-switching device using a graphene or a nano structure which may access a variable resistor may be used instead of a field effect transistor (FET). In still another embodiment, a vertical device such as a bipolar transistor may be used as a switching device to increase the degree of integration.

In FIG. 1B, one end of the MTJ 100B included in a memory cell is connected to a first wiring (e.g., a bit line BL) through a second electrode EL2. The other end of the MTJ 100B is connected to an anode P (e.g., a P-type semiconductor layer) of a PN diode D1 through a first electrode EL1. A cathode N (e.g., an N-type semiconductor layer) of the PN diode DI is connected to a second wiring (e.g., a word line WL).

In an embodiment, each of the bit lines BL and the word lines WL may form a pattern having the appearance of a plurality of stripes extending in different directions, so that the stripes, which correspond to the bit lines BL and the word lines WL intersect. When the MTJs 100B are disposed at the intersection points of the stripes, the memory cells form a cross-point array structure having a degree of integration of 4F².

The present disclosure is not limited to the PN diode DI illustrated in FIG. 1B. For example, the polarity of the PN diode DI in FIG. 1B may be reversed as long as the diode DI may select a cell according to a potential difference between the word line WL and the bit line BL. In another embodiment, the diode DI may be a bidirectional diode using a driving method such as a unidirectional switching method. Alternatively, other types of diodes including a Schottky diode, a Zener diode, a p-type semiconductor-intrinsic semiconductor-n-type semiconductor (PIN) diode, and a p-type semiconductor-intrinsic semiconductor-metal (PIM) diode may be used along with or instead of the diode DI for the MTJ 100B. Selection of a diode type may be based on the desired rectification characteristics such as increasing a memory capacity, increasing a level of an on-current, or performing a multi-bit operation.

The word line WL formed on the substrate 100 may be a metal wiring pattern layer. For example, the metal wiring pattern layer may include a metal (e.g., aluminum, copper, or an alloy thereof) or a conductive metal oxide. The metal pattern wiring layer may be formed by depositing an appropriate metal film on the substrate 100 and performing photolithography or etching on the metal film, or by performing damascene or dual damascene process. Alternatively, the word line WL may be a high-density impurity layer including n-type or p-type impurity ions. The high-density impurity layer may be formed by injecting n-type or p-type impurity ions into an active region of the memory cell of the substrate 100.

In the magnetic memory devices 1000A and 1000b of FIGS. 1A and 1B, first and second electrodes EL1 and EL2 are provided to both end portions of the MTJs 100A and 100B. The first and second electrodes EL1 and EL2 may show Schottky barrier characteristics by having an appropriate work function or an ohmic contact. In an embodiment, the first and second electrodes EL1 and EL2 may include platinum (Pt), tungsten (W), gold (Au), palladium (Pd), rhodium (Rh), iridium (Ir), ruthenium (Ru), tantalum (Ta), molybdenum (Mo), chromium (Cr), vanadium (V), titanium (Ti), aluminum (Al), copper (Cu), silver (Ag), nickel (Ni), or a conductive nitride thereof, a conductive oxide thereof, or a combination thereof. The first and second electrodes EL1 and EL2 may be electrically insulated by at least one interlayer insulating film ID.

Each of the MTJs 100A and 100B includes a pinned magnetic layer 110, a nonmagnetic insulating layer 120, and a free magnetic layer 130. A unidirectional arrow in the pinned magnetic layer 110 indicates that the pinned magnetic layer 110 has a pinned magnetization in a certain direction. On the other hand, a bidirectional arrow in the free magnetic layer 130 indicates that the free magnetic layer 130 may be magnetized in a parallel or antiparallel direction to the magnetization direction of the pinned magnetic layer 110. In an embodiment, the position of the pinned magnetic layer 110 and the free magnetic layer 130 may be reversed, with the nonmagnetic insulating layer 120 being provided therebetween. In another embodiment, the nonmagnetic insulating layer 120 and the pinned magnetic layer 110 may be sequentially stacked on opposing sides of the free magnetic layer 130 to form a symmetric MTJ. That is, the symmetric MTJ has two pinned magnetic layers 110 as well as two nonmagnetic insulating layers 120 disposed symmetrically with respect to the free magnetic layer 130. The symmetric MTJ may direct a current for programming and erasing data of a memory cell in one direction.

Since a magnetization direction of the pinned magnetic layer 110 is fixed irrespective of a magnitude of an external magnetic field, the pinned magnetic layer 110 may be a ferromagnetic layer with high coercivity. For example, the ferromagnetic layer may include Fe, Co, Ni, or an alloy thereof such as CoFe, NiFe, or CoNiFe. In another embodiment, the ferromagnetic layer may include a doped alloy (e.g., CoX, CoNiFeX, or CoFeX), where X may be B, Cu, Re, Ru, Rh, Hf, Pd, Pt, Ta, Os, Ge, Ir, Au, Ag, C, or a combination thereof. Alternatively, the ferromagnetic layer may include a half-metallic ferromagnetic material such as $Fe_3O_4$, $CrO_2$, NiMnSb, PtMnSb, or BiFeO. These materials are exemplary, and the present embodiment is not limited thereto. For example, the pinned magnetic layer 110 may include any of other well-known ferromagnetic materials such as Gd, Dy, $Y_3Fe_5O_{12}$, MnSb, and MnAs. Further, the pinned magnetic layer 110 may include a combination of the above materials with any one of B, Cu, Re, Ru, Rh, Hf, Pd, Pt, Os, Ir, Au, Ag, C, or a combination thereof.

In another embodiment, the pinned magnetic layer 110 may have a multi-layer structure including a plurality of exchange-biased bilayers, each of which has an anti-ferromagnetic layer (not shown), and the ferromagnetic layer. The anti-ferromagnetic layer may include, for example, any of PtMn, IrMn, MnO, MnS, MnTe, $MnF_2$, $FeCl_2$, FeO, $CoCl_2$, CoO, $NiCl_2$, and NiO. Alternatively, the anti-ferromagnetic layer may have a synthetic-anti-ferromagnetic (SAF) structure in which a nonmagnetic conductive layer (e.g., Ru) is inserted between two ferromagnetic layers.

The nonmagnetic insulating layer 120 may include a metal oxide such as $Al_2O_3$, MgO, $TiO_2$, AlN, RuO, SrO, SiN, $CaO_x$, $HfO_2$, $Ta_2O_5$, $ZrO_2$, SiC, $SiO_2$, $SiO_xN_y$, a combination thereof (e.g., $AlTiO_x$), or a stacked thin film thereof. The nonmagnetic insulating layer 120 may be a nonconductive magnetic layer or a nonconductive nonmagnetic layer. The nonmagnetic insulating layer 120 has a substantially uniform nanoscale thickness. Radio frequency (RF) sputtering with a metal oxide target (e.g., sintered $Al_2O_3$, MgO, or TiO) may be used to form the nonmagnetic insulating layer 120. In an embodiment, a metal film having a thickness of several Å may be formed first by using DC sputtering. Subsequently, an in-situ native oxide film is formed, or a separate oxidation process in an oxygen atmosphere is performed simultaneously with a metal film forming process, to provide the nonmagnetic insulating layer 120.

However, the method of manufacturing the nonmagnetic insulating layer 120 is not limited to the above methods. For example, the nonmagnetic insulating layer 120 may be formed by using chemical vapor deposition (CVD) method with an appropriate precursor, or a different physical vapor deposition (PVD) method (e.g., electron-beam evaporation) from the above sputtering methods. The nonmagnetic insulating layer 120 may be crystalline or amorphous.

The free magnetic layer 130 may include zirconium (Zr) and a soft magnetic material formed of cobalt (Co) or a Co-based alloy. In another embodiment, the free magnetic layer 130 may include at least one soft magnetic amorphous alloy layer including Zr and the soft magnetic material. For example, the soft magnetic amorphous alloy layer may be CoZr or CoFeZr. Zr content in the free magnetic layer 130 may range from about 5 atomic % to about 40 atomic %. When the Zr content is less than 5 atomic %, since magnetic characteristics of Co are maintained due to the low Zr content, a critical behavior of the free magnetic layer 130 does not occur, which will be described in greater detail below. In this case, diffusion of Co into an adjacent insulating layer or nonmagnetic metal layer is not effectively prevented. On the other hand, when the Zr content exceeds 40 atomic %, the critical behavior does not occur. In this case, since an effect of an amorphous structure is dominant, a magnetization of the free magnetic layer 130 becomes insufficient.

A thickness of the free magnetic layer 130 may be less than or greater than a critical thickness that ranges from about 0.5 nm to about 1.5 nm. For example, a free magnetic layer 130 having a thickness less than the critical thickness may be included in the MTJ 100B having MPP characteristics of FIG. 1B. On the other hand, a free magnetic layer 130 having a thickness exceeding the critical thickness may be included in the MTJ 100A having IPM characteristics of FIG. 1A.

A resistance value of the MTJs 100A and 100B through which a current flows may be changed by a magnetization direction of the free magnetic layer 130 relative to the pinned magnetic layer 110. For example, when a magnetization direction of the free magnetic layer 130 is opposite to a magnetization direction of the pinned magnetic layer 110, the MTJs 100A and 100B may be in a high resistance state (i.e., may have a high resistance value). When the free magnetic layer 130 and the pinned magnetic layer 110 have the same magnetization direction, the MTJs 100A and 100B may be in a low resistance state (i.e., may have a low resistance value). Data of the free magnetic layer 130 may be read using the different resistance states. For instance, the high resistance state and low resistance state of the MTJs 100A and 100B may correspond to a logic value "0" and "1", respectively, and data of the free magnetic layer 130 may be read as one of the logic values.

Programming of the MTJs 100A and 100B may be performed by using a programming current. For example, the programming current may have a predetermined current density sufficient to switch a magnetization direction of the free magnetic layer 130 to the same or opposite magnetization direction of the pinned magnetic layer 110. When the programming current passes through the pinned magnetic layer 110, the programming current may be spin-polarized. When the spin-polarized current is directed to the free magnetic layer 130, information may be written to the MTJs 100A and 100B by transferring angular momentum to the free magnetic layer 130.

Figure 2A:
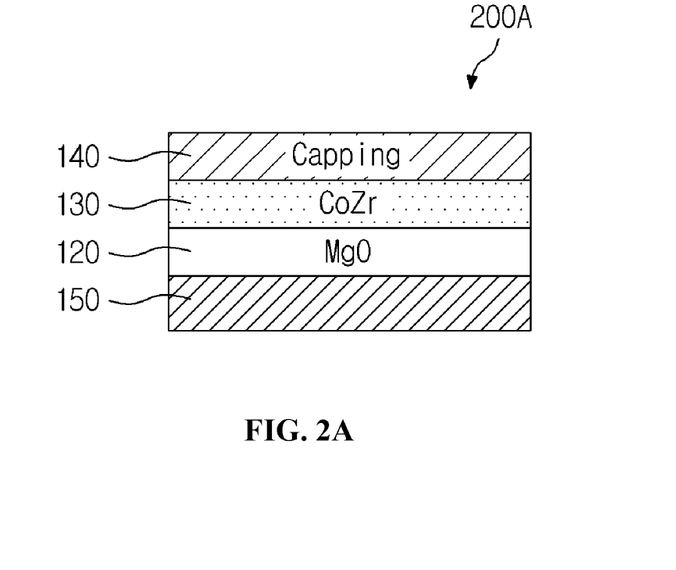
FIGS. 2A through 2C are cross-sectional views illustrating MTJs according to embodiments of the present disclosure.
Figure 2B:
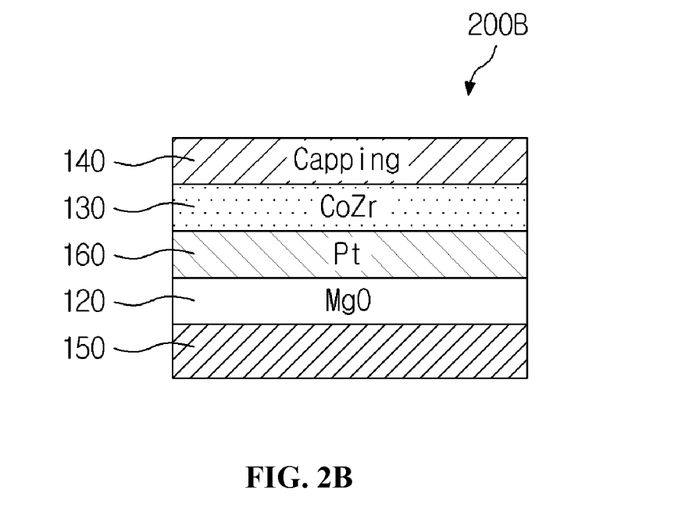
Figure 2C:
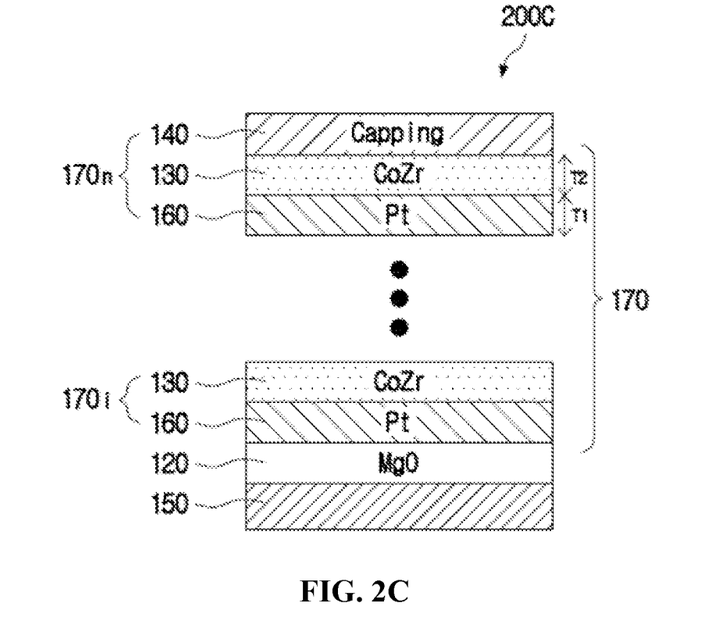

FIGS. 2A through 2C are cross-sectional views illustrating MTJs 200A, 200B, and 200C according to embodiments of the present disclosure.

Referring to FIG. 2A, the MTJ 200A includes the free magnetic layer 130 formed on the insulating layer 120, as described with reference to FIG. 1A. The free magnetic layer 130 may include at least one soft magnetic amorphous alloy layer in which Zr is added to a soft magnetic material (e.g., Co or a Co-based alloy).

A layer 150, which is separated from the free magnetic layer 130 by the nonmagnetic insulating layer 120, may be a pinned magnetic layer and/or an antimagnetic layer as described above. In an embodiment, the layer 150 may further include a seed layer providing a surface to enable the pinned magnetic layer and/or the antimagnetic layer to grow well.

In an embodiment, a capping layer 140 may be further formed on the free magnetic layer 130. For example, the capping layer 140 may have a crystal structure having a lattice constant substantially the same as that of the free magnetic layer 130. In an embodiment, the capping layer 140 may be formed of Co or an alloy thereof having a cubic structure. In another embodiment, the capping layer 140 may be formed of any appropriate material which may increase tunnel magnetoresistance (TMR) during magnetic annealing, which is typically included in manufacturing processes of the MTJs 200A, 200B, and 200C.

Referring to FIG. 2B, the MTJ 200B may further include a nonmagnetic metal layer 160 disposed between the insulating layer 120 and the free magnetic layer 130 (e.g., the soft magnetic amorphous alloy layer). For example, the nonmagnetic metal layer 160 may be formed of Rh, Hf, Pd, Pt, Ta, Os, Ge, Ir, Au, Ag, or an alloy thereof.

Referring to FIG. 2C, the MTJ 200C may include a multi-layer structure 170, which includes a plurality of stacked structure units. That is, in an embodiment, the multi-layer structure 170 may have an n-layered structure that includes structure units $170_1, \ldots, 170_n$. Each of the stacked structure units includes at least a two-part layer, which is a stack of the nonmagnetic metal layer 160 and a soft magnetic amorphous alloy layer 130, as shown in FIG. 2B. The number of stacked structure units in the multi-layer structure 170 may range from about 2 to about 20.

A thickness T1 of the nonmagnetic metal layer 160 may be thin enough that it does not affect a spin direction of electrons, but thick enough to induce an MPP. Accordingly, a ratio of a thickness T2 of the soft magnetic amorphous alloy layer 130 to a thickness T1 of the nonmagnetic metal layer 160 may range from about 1.3 to about 1. In the multi-layer structure 170, a plurality of the soft magnetic amorphous alloy layers may be magnetically coupled to one another, thereby improving thermal stability of the MTJ 200C and reducing a programming current level.

Embodiments will be explained in further detail by using experimental examples. However, embodiments of the present disclosure are not limited to the examples described below.

Experimental Examples

A free magnetic layer having a multi-layer structure (hereinafter referred to as a CoZr/Pt stacked film) according to an embodiment of the present disclosure was prepared using DC magnetron sputtering in a dual chamber sputtering system (Infovion, Inc.). Specifically, the CoZr/Pt stacked film was formed by repeatedly stacking a CoZr/Pt stacked structure unit (i.e., a CoZr/Pt two-part layer shown in FIG. 2C) ten times on a silicon-silicon oxide substrate, whose oxide thickness is about 300 nm. Before deposition of the multi-layer structure, a base pressure of a chamber was controlled to be equal to or less than $5 \times 10^{-8}$ Torr. During the deposition, Ar gas was introduced and maintained at a substantially constant pressure near 2 mTorr. For a fixed DC power of 30 W, deposition rates of Pt and CoZr were respectively 2.44 and 1.4 Å/s.

For purposes of comparison, a free magnetic layer having a multi-layer structure (hereinafter, referred to as a Co/Pt stacked film) was manufactured as a comparative example by repeatedly stacking a Co/Pt stacked structure unit (i.e., a Co/Pt two-part layer) ten times. Conditions for manufacturing the Co/Pt stacked film were the same as those for the CoZr/Pt stacked film. A deposition rate of a Co thin film was 1.14 Å/s.

Thicknesses of thin films in the CoZr/Pt stacked film and the Co/Pt stacked film were measured by using a low-angle X-ray diffractometer (D-Max 2500, manufactured by Rigaku Inc). A Cu Kα X-ray having a wavelength of about 0.15406 nm was used, and operation bias conditions of the X-ray diffraction (XRD) were 40 V and 100 mA. A scan speed was 4° per minute, when a scan angle was 0~10° in a 2θ mode. The multi-layer films induced a modulation period for a diffraction peak. Thicknesses of the two-part layers in the CoZr/Pt stacked film and the Co/Pt stacked film were calculated by $t = n\lambda/2 \sin \theta$, where n is an order of the diffraction peak, λ is a wavelength of an X-ray, and θ is an angle of a peak position.

Individual thicknesses of the CoZr film, the Co film, and the Pt film were obtained by physically measuring the thicknesses in cross-sectional scanning electron microscope (SEM) images. Thicknesses of the CoZr films according to embodiments of the present disclosure were 0.6 nm, 0.87 nm, and 1.2 nm. A thickness of the Co film of the comparative example was about 0.7 nm. A thickness of the Pt film was about 1.7 nm in both the present embodiment and the comparative example.

Using a crank-driven vibrating sample magnetometer (manufactured by Lake Shore Inc.), magnetization measurements were recorded in in-plane and perpendicular-to-the-plane M-H loop graphs. The magnetization measurements were calibrated using a standard single-crystal Ni sample to sense weak signals of an MPP.

Thermal stability of the CoZr/Pt stacked film and the Co/Pt stacked film was measured by an annealing process, performed at a temperature up to 300° C. in a vacuum chamber ($10^{-6}$ Torr) having a halogen heater. While the samples were naturally cooled from 300° C. in the vacuum chamber ($10^{-6}$ Torr), field cooling was performed by applying a magnetic field of 1.5 Tesla induced by a superconducting magnet (manufactured by Futek Furnace Inc.).

Figure 3A:
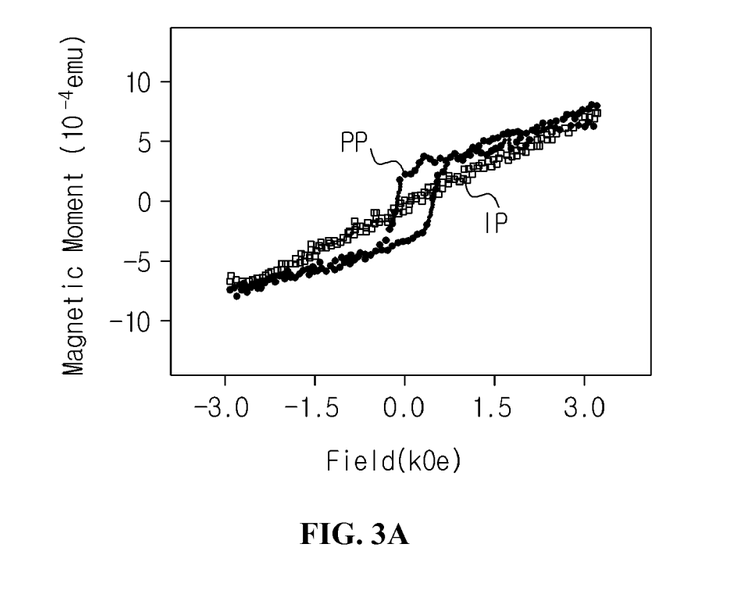
FIGS. 3A and 3B are M-H loop graphs of a CoZr(0.6 nm)/Pt(1.7 nm) stacked film according to an embodiment of the present disclosure and a Co(0.7 nm)/Pt(1.7 nm) stacked film according to a comparative example, respectively.
Figure 3B:
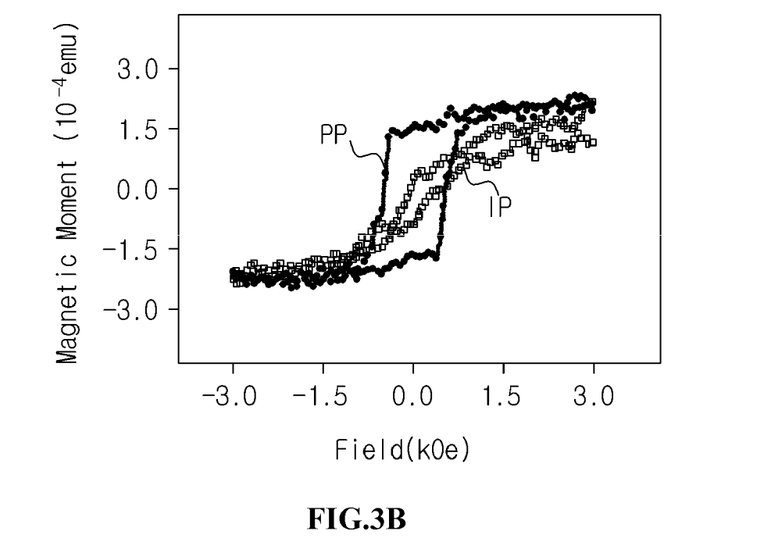

FIG. 3A is a M-H loop graph of a CoZr(0.6 nm)/Pt(1.7 nm) stacked film according to an embodiment of the present disclosure. FIG. 3B is a M-H loop graph of a Co(0.7 nm)/Pt(1.7 nm) stacked film according to the comparative example. Each of the CoZr/Pt stacked and Co/Pt stacked films were deposited on an $SiO_2$/Si substrate. In FIGS. 3A and 3B, points (●) on a curve PP indicate MPP characteristics and points (□) on a curve IP indicate IPM characteristics.

Referring to FIG. 3A, in the CoZr(0.6 nm)/Pt(1.7 nm) stacked film according to an embodiment of the present disclosure, MPP characteristics are observed while IPM characteristic are not. The MPP characteristics are induced by interface anisotropy of the CoZr(0.6 nm)/Pt(1.7 nm) stacked film. Referring to FIG. 3B, in the Co(0.7 nm)/Pt(1.7 nm) stacked film according to the comparative example both MPP and IPM characteristics are observed, although the MPP characteristics are dominant over the IPM characteristics.

For the CoZr(0.6 nm)/Pt(1.7 nm) stacked film, values of μ0HK, μ0HC, Ms (saturated magnetization), and K (magnetic anisotropic constant) are about 300 mT, 35 mT, 2.42 T, and $2.89 \times 10^5$ (J/m³), respectively. In this case, a critical current density for spin transfer torque (STT) magnetization switching may be reduced to 106 A/cm² or less. Accordingly, the CoZr(0.6 nm)/Pt(1.7 nm) stacked film is suitable to be used along with a typical switching device such as a complementary metal oxide semiconductor (CMOS). On the other hand, the Co(0.7 nm)/Pt(1.7 nm) stacked film according to the comparative example shows both IPM characteristics and MPP characteristics and has a high switching field. Due to such characteristics of the Co(0.7 nm)/Pt(1.7 nm) stacked film, a critical current density of the for STT magnetization switching is higher in the comparative example than that in this embodiment. In this sense, this embodiment of the present disclosure has advantages over the comparative example.

Figure 4:
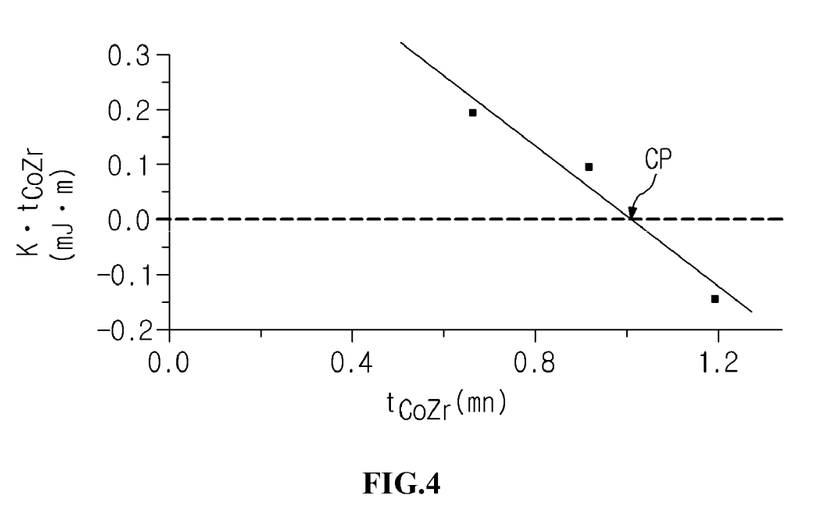
FIG. 4 is a graph illustrating a relationship between MPP characteristics and a thickness change of a CoZr film in the CoZr/Pt stacked film stacked on an $SiO_2$/Si substrate according to an embodiment of the present disclosure.

FIG. 4 is a graph illustrating a relationship between MPP characteristics and a thickness change of the CoZr film in the CoZr/Pt stacked film according to an embodiment of the present disclosure.

Referring to FIG. 4, measurement results obtained where thicknesses of the $Co_{90}Zr_{10}$ film are 0.6 nm, 0.87 nm, and 1.2 nm are extrapolated. As a result of the extrapolation, MPP characteristics of the CoZr/Pt stacked film due to interface anisotropy (Ki) are observed up to a thickness of 0.98 nm corresponding to CP. In other words, MPP characteristics of the CoZr/Pt stacked film are observed below the maximum thickness of the CoZr film about 1 nm. When a thickness of the CoZr film exceeds 1 nm, IPM characteristics of the CoZr/Pt stacked film are observed.

As discussed above, the CoZr film shows a transitional characteristic from MPP characteristics to IPM characteristics at a critical thickness (e.g., 1 nm). The critical thickness may range from 0.5 nm to 1.5 nm. The critical thickness of the CoZr film, which shows such a transitional behavior, may be adjusted according to a Zr content in the CoZr film and a type of an adjacent nonmagnetic metal film (e.g., the Pt film). Specifically, as the Zr content increases, a vertical anisotropy of the CoZr film decreases and thus the critical thickness may decrease. However, the critical thickness remains substantially the same regardless of the number of two-part layers including the CoZr film and the nonmagnetic metal film in a multi-layer structure. In other words, the critical thickness does not change even when the number of the two-part layers increases. A thickness of the Co/Zr film may be less than or greater than the critical thickness according to desired magnetization characteristics and a margin of a thin film deposition process.

On the other hand, the Co(0.7 nm)/Pt(1.7 nm) stacked film according to the comparative example shows MPP characteristics up to a thickness of the Co film about 1.5 nm. However, both MPP characteristics and IPM characteristics are observed in this range.

The critical behavior occurring in the CoZr(0.6 nm)/Pt(1.7 nm) stacked film according to this embodiment of the present disclosure may be due to the existence of Zr. Specifically, Zr existing in a Co alloy or a Co-based alloy effectively prevents formation of an atomic structure of Co for reaction with Pt in an adjacent nonmagnetic metal layer. In contrast, when Zr is not present, as in the comparative example, IPM characteristics and MPP characteristics may coexist. In this case, as a thickness of the Co film increases, the IPM characteristics become dominant over the MPP characteristics.

Figure 5A:
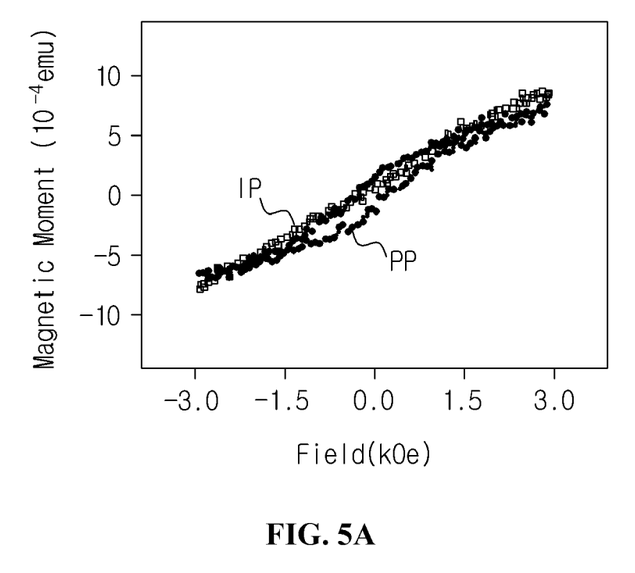
FIGS. 5A and 5B are M-H loop graphs obtained by annealing near 300° C. and then cooling a CoZr(0.6 nm)/Pt(1.7 nm) stacked film according to an embodiment of the present disclosure and a Co(0.7 nm)/Pt(1.7 nm) stacked film according to a comparative example, respectively.
Figure 5B:
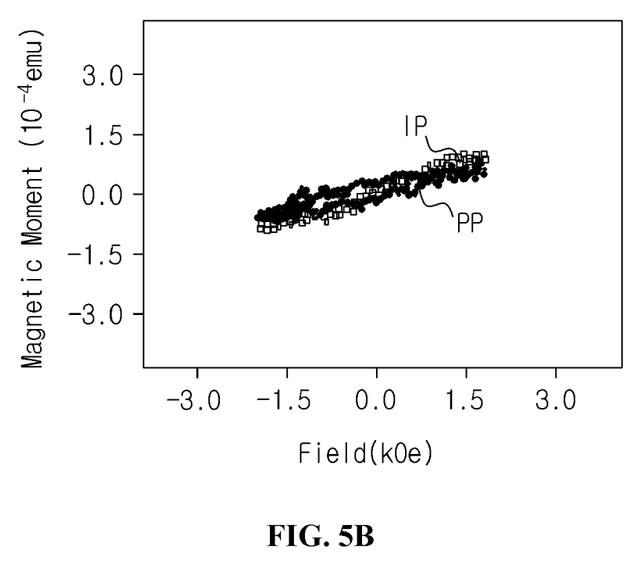

FIGS. 5A and 5B are M-H loop graphs obtained by annealing near 300° C. and then cooling a CoZr(0.6 nm)/Pt(1.7 nm) stacked film and a Co(0.7 nm)/Pt(1.7 nm) stacked film, respectively. The CoZr(0.6 nm)/Pt(1.7 nm) stacked film according to an embodiment of the present disclosure and the Co(0.7 nm)/Pt(1.7 nm) stacked film according to a comparative example are deposited on an $SiO_2$/Si substrate. In FIGS. 5A and 5B, points (●) on a curve PP indicate MPP characteristics and points on (□) a curve IP indicate IPM characteristics.

Referring to FIG. 5A, even after annealing of the CoZr(0.6 nm)/Pt(1.7 nm) stacked film near 300° C., the CoZr(0.6 nm)/Pt(1.7 nm) stacked film still shows MPP characteristics. By contrast, as shown in FIG. 5B, after annealing of the Co(0.7 nm)/Pt(1.7 nm) stacked film around 300° C., MPP characteristics of the Co(0.7 nm)/Pt(1.7 nm) stacked film are substantially removed. Accordingly, a free magnetic layer having a multi-layer structure (e.g., the CoZr(0.6 nm)/Pt(1.7 nm) stacked film) according to this embodiment of the present disclosure has excellent thermal stability as well as MPP characteristics due to interface anisotropy. Using such a free magnetic layer, a magnetic memory device having a reliable MTJ may be provided.

Figure 6A:
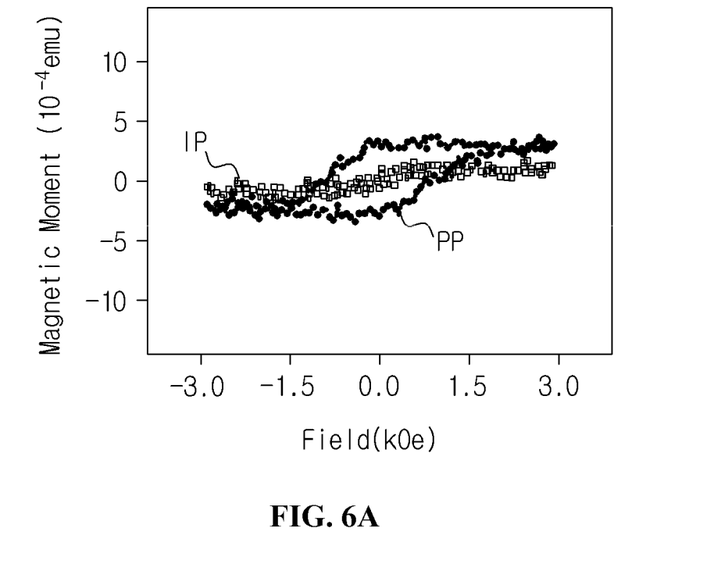
FIGS. 6A and 6B are M-H loop graphs obtained by annealing near 300° C. and then performing field cooling on a CoZr(0.6 nm)/Pt(1.7 nm) stacked film according to an embodiment of the present disclosure and a Co(0.7 nm)/Pt (1.7 nm) stacked film according to a comparative example, respectively.
Figure 6B:
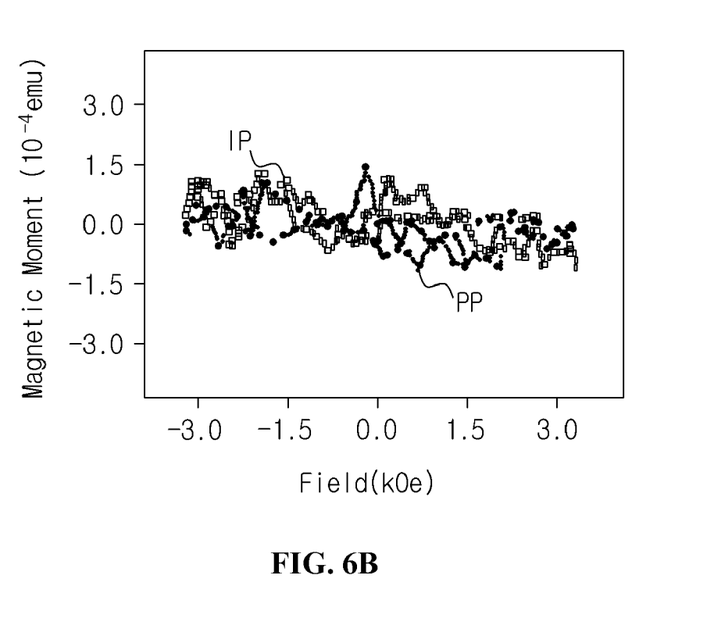

FIGS. 6A and 6B illustrate M-H loop graphs obtained by annealing near 300° C. and then performing field cooling on a CoZr(0.6 nm)/Pt(1.7 nm) stacked film according to an embodiment, and a Co(0.7 nm)/Pt(1.7 nm) stacked film as an example for purposes of comparison. During the field cooling, an external magnetic field of about 3 Tesla is applied in a direction perpendicular to a plane. The CoZr(0.6 nm)/Pt(1.7 nm) stacked film according to an embodiment of the present disclosure and the Co(0.7 nm)/Pt(1.7 nm) stacked film according to the comparative example are deposited on an $SiO_2$/Si substrate. Points (●) on a curve PP indicate MPP characteristics and points (□) on a curve IP indicate IPM characteristics.

Referring to FIG. 6A, recovery of MPP characteristics of the CoZr(0.6 nm)/Pt(1.7 nm) stacked film in accordance with an embodiment of the present disclosure is observed. This is because deterioration of interface anisotropy is suppressed in the annealing process near 300° C. Specifically, Zr atoms in the CoZr film suppress mixing of Co atoms and Pt atoms in the CoZr/Pt two-part layer. Thus, a CoZr/Pt interface is maintained even after the annealing process.

However, referring to FIG. 6B, in the Co(0.7 nm)/Pt(1.7 nm) stacked film (i.e., the comparative example), an induced magnetization is substantially removed due to a thermal stress caused by the annealing process. This is because Co atoms and Pt atoms in the Co/Pt two-part layer are mixed, and thus the Co/Pt two-part layer is replaced by a CoPt alloy layer which is magnetically inactive.

Figure 7A:
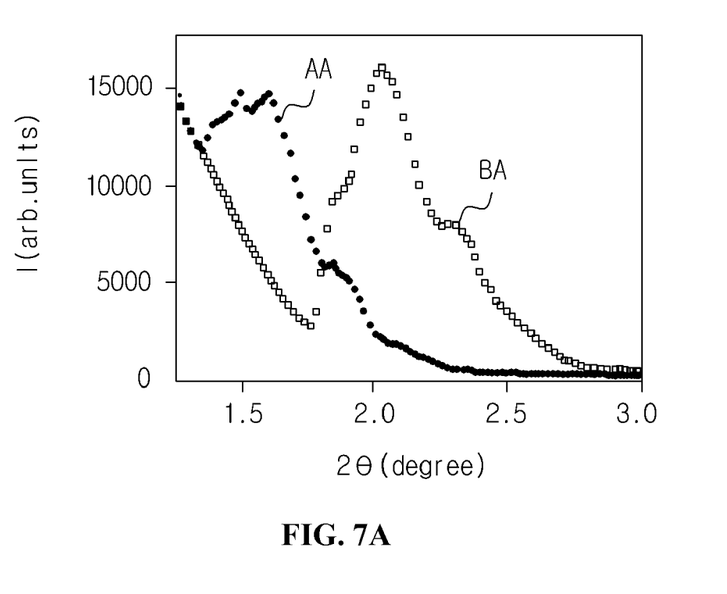
FIGS. 7A and 7B are graphs illustrating a first peak and a second peak of a low-angle X-ray diffraction (XRD) image of a CoZr(0.6 nm)/Pt(1.7 nm) stacked film according to an embodiment of the present disclosure.
Figure 7B:
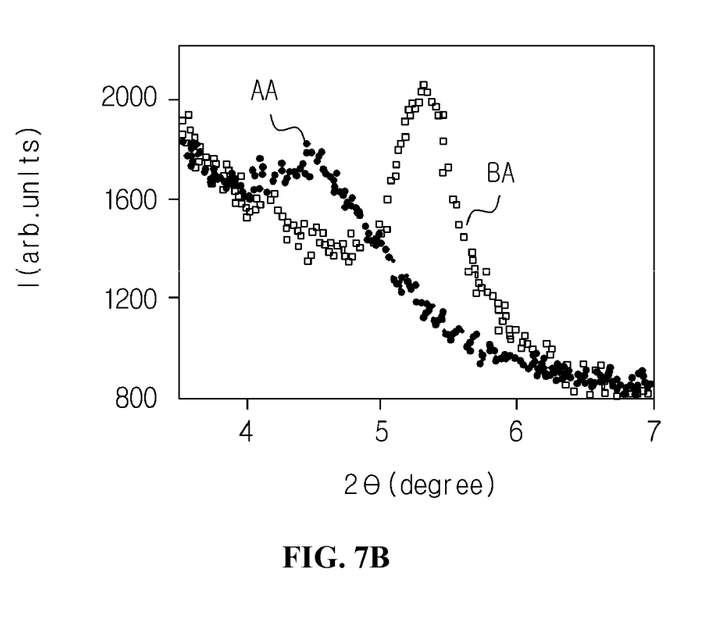
Figure 7C:
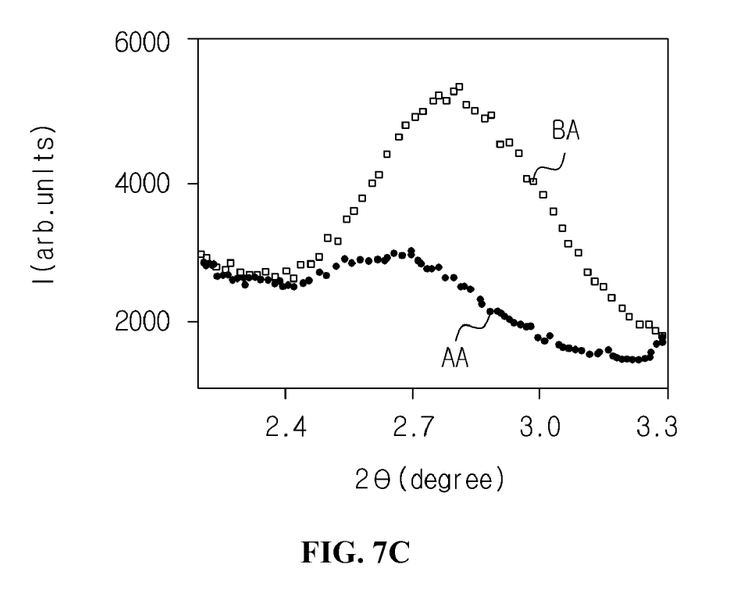
FIGS. 7C and 7D are graphs illustrating a first peak and a second peak of a low-angle XRD image of A Co(0.7 nm)/Pt (1.7) stacked film according to a comparative example.
Figure 7D:
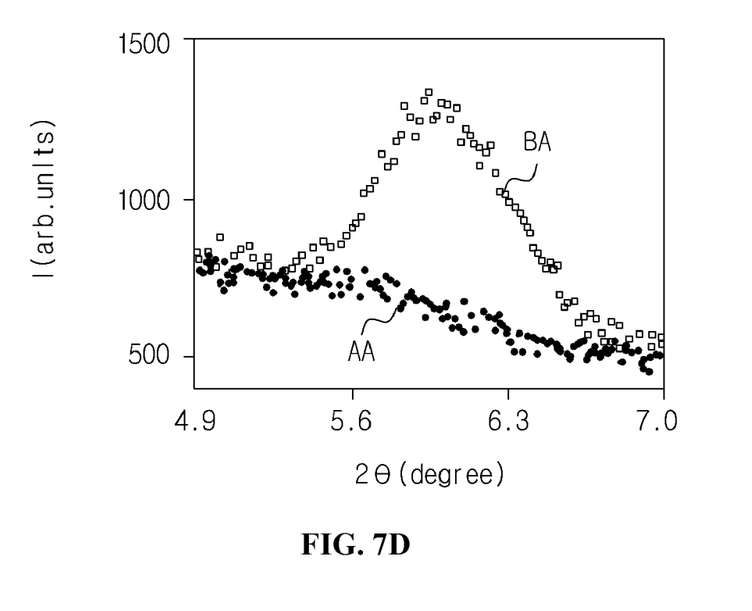

FIGS. 7A and 7B are graphs illustrating a first peak and a second peak of a low-angle XRD image of a CoZr(0.6 nm)/Pt(1.7 nm) stacked film according to an embodiment of the present disclosure. The peaks were analyzed to determine interface characteristics of a CoZr/Pt two-part layer after a heat treatment (e.g., annealing). FIGS. 7C and 7D are graphs illustrating a first peak and a second peak of a low-angle XRD image of a Co(0.7 nm)/Pt(1.7) stacked film according to a comparative example. In each graph, points (●) on a curve BA indicate measurement results before annealing, and points (□) on a curve AA indicate measurement results after the annealing is performed around 300° C. for 1 hour.

Referring to FIGS. 7A and 7B, the CoZr(0.6 nm)/Pt(1.7 nm) stacked film in accordance with an embodiment of the present disclosure has a first peak and a second peak after the annealing around 300° C. This is because even after the annealing, a CoZr/Pt two-part layer still remains. These analysis results are consistent with the magnetization measurement results of FIGS. 5A and 6A. The first and second peaks after the annealing are shifted to smaller angles than the corresponding peaks before the annealing. This is because a thickness of the interface between CoZr(0.6 nm)/Pt(1.7 nm) two-part layer has been increased after the annealing process is performed.

According to an embodiment of the present disclosure, a free magnetic layer may be formed by adding Zr to Co or a Co-based alloy. After performing an STT method or an MFW method on the free magnetic layer, the free magnetic layer may show MPP or IPM characteristics according to a thickness of the free magnetic layer. Specifically, when the thickness is equal to or less than a critical thickness, the free magnetic layer shows MPP characteristics. When the thickness is greater than the critical thickness, the free magnetic layer shows IPM characteristics. In other words, an MTJ having a high degree of design freedom may be provided. For example, by designing a free magnetic layer with a thickness equal to or less than a critical thickness (e.g., 1.2 nm) and using the STT method, a scalable nonvolatile memory device having MPP characteristics may be provided. In addition, by adding Zr to a soft magnetic amorphous material (e.g. Co or Co-based alloy) to maintain crystal anisotropy with an adjacent nonmagnetic metal layer (e.g., a Pt film) and by designing a thickness of a two-part layer (e.g., a CoZr/Pt two-part layer) to be equal to or less than 1.2 nm, an MTJ having excellent thermal stability as well as MPP characteristics may be provided.

Compared to a CoFeB film, which is obtained by adding boron (B) to improve switching stability of a conventional MTJ including a soft magnetic thin film (e.g., CoFe), a high spin polarization may be induced in a CoZr film. This is because Zr is a transition metal whose d orbitals are partially empty, which is different from B. As a result, when a Co-based alloy is formed with Zr, loss of magnetization performance is reduced compared to that in the case of a Co-based alloy formed with B. Accordingly, according to an embodiment of the present disclosure, an MTJ which shows stable write characteristics and reduced magnetoresistance loss may be provided.

Various MTJs described in the present application with reference to the drawings may be realized in the form of a single memory device. Alternatively, these MTJs may be realized in the form of a system-on-chip (SOC) with other devices such as a logic processor, an image sensor, and an RF device. Also, one wafer chip on which the memory device is formed and another wafer chip on which a different type of device is formed may be realized as one chip by coupling the two wafers using an adhesive, soldering, or wafer bonding. Magnetoresisance characteristics of an MTJ also may be used as a fuse or an antifuse in other devices such as a logic processor.

Also, the memory devices may be formed as any of various semiconductor packages. For example, nonvolatile memory devices according to embodiments of the present disclosure may be packaged by using package on package (PoP), Ball grid arrays (BGAs), chip scale packages (CSPs), Plastic Leaded Chip Carrier (PLCC), Plastic Dual In-Line Package (PDIP), Die in Waffle Pack, Die in Wafer FoSM, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), or Wafer-Level Processed Stack Package (WSP). A package on which memory devices are mounted may further include a controller and/or a logic device for controlling the memory devices.

Figure 8:
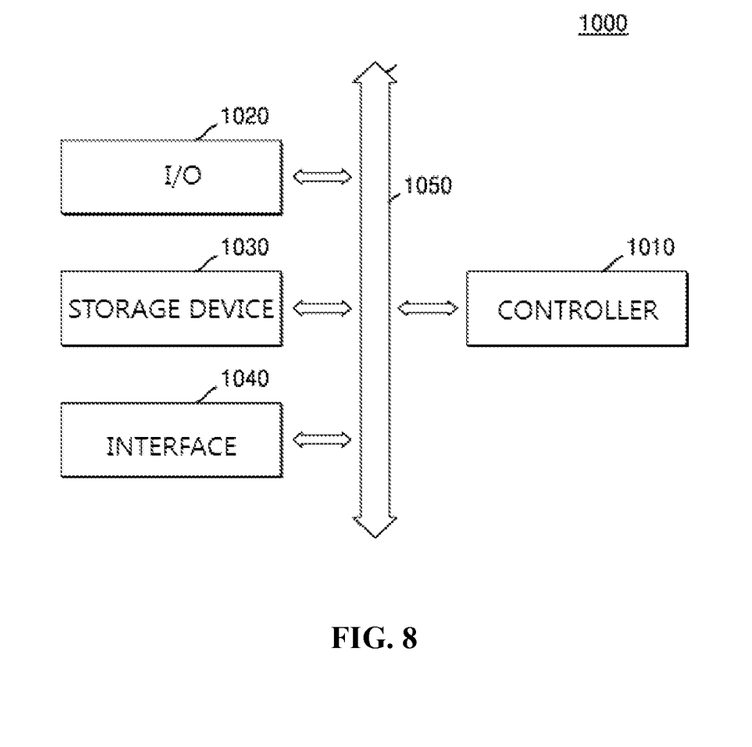
FIG. 8 is a block diagram illustrating an electronic system including a nonvolatile memory device, according to an embodiment of the present disclosure.

FIG. 8 is a block diagram illustrating an electronic system 1000 including a nonvolatile memory device, according to an embodiment of the present disclosure.

Referring to FIG. 8, the electronic system 1000 may include a controller 1010, an input/output (I/O) device 1020, a storage device 1030, an interface 1040, and a bus 1050. The controller 1010, the I/O device 1020, the storage device 1030, and/or the interface 1040 may be coupled to one another via the bus 1050.

The controller 1010 may include at least one of a microprocessor, a digital signal processor, a microcontroller, and logic devices performing functions similar to those of the devices. The I/O device 1020 may include a keypad, a keyboard, or a display device.

The storage device 1030 may store data and/or commands, and the storage device 1030 may include an MTJ according to embodiments of the present disclosure as a data storage unit. Alternatively, the storage device 1030 may have a mixed structure further including another type of semiconductor memory device (for example, a dynamic RAM (DRAM) and/or an embedded static RAM (ESRAM)). The interface 1040 may transmit or receive data to or from a communication network. The interface 1040 may be a wired or wireless interface. For example, the interface 1040 may include an antenna or a wired/wireless transceiver. Although not shown in FIG. 8, the electronic system 1000 may further include a high-speed DRAM and/or ESRAM as an operation memory for improving an operation of the controller 1010.

The electronic system 1000 may include a personal digital assistant (PDA), a portable computer, a tablet PC, a wireless phone, a mobile phone, a digital music player, a memory card, a solid storage device (SSD), a computer, a display, a digitizer, an input unit (e.g., a mouse), or an electronic device that may transmit and/or receive information in a wireless environment.

According to an embodiment of the present disclosure, in a free magnetic layer, formed by adding Zr to a Co layer or a Co-based alloy layer included in an MTJ, diffusion of Co atoms to an interface between a CoZr layer and an adjacent Pt layer is blocked. As a result, deterioration of magnetic characteristics due to mixing of Co and Pt atoms at the interface caused by thermal energy may be substantially reduced or prevented. In this manner, a non-volatile memory device having excellent thermal stability may be provided.

In addition, in accordance with an embodiment of the present disclosure, when a thickness of a free magnetic layer is equal to or less than a critical thickness, an MTJ having MPP characteristics may be provided. Also, since Zr is a transition metal whose d orbitals are partially empty, unlike B, loss of magnetization performance is low when a Co-based alloy is formed with Zr compared to that formed with B. Accordingly, an MTJ having low magnetoresistance loss may be provided.

While embodiments of the present disclosure have been particularly shown and described, it will be understood by those of ordinary skill in the art that various changes in form and details may be made therein without departing from the spirit and scope of the present invention as defined by the following claims.

What is claimed is:

1. A nonvolatile magnetic memory device comprising:
a magnetic tunnel junction (MTJ), the MTJ comprising a pinned magnetic layer, a nonmagnetic insulating layer, and a free magnetic layer,
wherein the free magnetic layer comprises at least one soft magnetic amorphous alloy layer, the soft magnetic amorphous alloy layer including zirconium (Zr) and any of cobalt (Co) or a Co-based alloy,
wherein the MTJ further comprises a nonmagnetic metal layer that is disposed between the nonmagnetic insulating layer and the free magnetic layer,
wherein the free magnetic layer has a multi-layer structure, and
wherein the multi-layer structure comprises a plurality of two-part layers repeatedly stacked on the nonmagnetic insulating layer, and wherein each of the two-part layers includes the soft magnetic amorphous alloy layer and the nonmagnetic metal layer.

2. The nonvolatile magnetic memory device of claim 1, wherein the free magnetic layer includes CoZr, CoFeZr, or a combination thereof.

3. The nonvolatile magnetic memory device of claim 1, wherein a Zr content in the free magnetic layer ranges from about 5 atomic % to about 40 atomic %.

4. The nonvolatile magnetic memory device of claim 1, wherein the free magnetic layer has magnetization perpendicular to a plane (MPP) characteristics when the free magnetic layer has a thickness less than a critical thickness.

5. The nonvolatile magnetic memory device of claim 4, wherein the free magnetic layer has in-plane magnetization (IPM) characteristics when the free magnetic layer has a thickness exceeding the critical thickness.

6. The nonvolatile magnetic memory device of claim 5, wherein the critical thickness ranges from about 0.5 nm to about 1.5 nm.

7. The nonvolatile magnetic memory device of claim 1, wherein the nonmagnetic metal layer comprises any of rhodium (Rh), hafnium (Hf), palladium (Pd), platinum (Pt), tantalum (Ta), osmium (Os), germanium (Ge), iridium (Ir), gold (Au), silver (Ag), and an alloy thereof.

8. The nonvolatile magnetic memory device of claim 1, wherein a ratio of a thickness of the free magnetic layer to a thickness of the nonmagnetic metal layer ranges from about 0.3 to about 1.

9. The nonvolatile magnetic memory device of claim 1, wherein the pinned magnetic layer has MPP characteristics.

10. The nonvolatile magnetic memory device of claim 1, the MTJ further comprising a second nonmagnetic insulating layer and a second pinned magnetic layer which are additionally stacked on the free magnetic layer, so that the MTJ has a symmetric structure with respect to the free magnetic layer.

11. The nonvolatile magnetic memory device of claim 1, further comprising a switching device that is connected to the MTJ, the switching device being configured to select a cell of the nonvolatile magnetic memory device.

12. The nonvolatile magnetic memory device of claim 11, wherein the switching device includes a diode that is serially connected to the MTJ, one end of the MTJ being connected to a first wiring and another end of the diode being connected to a second wiring.

13. The nonvolatile magnetic memory device of claim 12, wherein the diode comprises a bidirectional diode.

14. The nonvolatile magnetic memory device of claim 11, wherein the switching device includes a transistor that is connected to the MTJ, one end of the MTJ being connected to a first wiring and another end of the MTJ being connected to the transistor.

15. The nonvolatile magnetic memory device of claim 14, wherein the transistor comprises a field effect transistor and a bipolar transistor.

16. The nonvolatile magnetic memory device of claim 1, wherein the MTJ further comprises a capping layer, the capping layer including Co or an alloy thereof.

17. A nonvolatile magnetic memory device comprising:
   a magnetic tunnel junction (MTJ), the MTJ comprising a pinned magnetic layer, a nonmagnetic insulating layer, and a free magnetic layer,
   wherein the free magnetic layer comprises at least one soft magnetic amorphous alloy layer, the soft magnetic amorphous alloy layer including zirconium (Zr) and any of cobalt (Co) or a Co-based alloy,
   wherein the free magnetic layer has a multi-layer structure, and
   wherein the multi-layer structure comprises a plurality of two-part layers repeatedly stacked on the nonmagnetic insulating layer, and wherein each of the two-part layers includes the soft magnetic amorphous alloy layer and a nonmagnetic metal layer.

18. The nonvolatile magnetic memory device of claim 17, wherein the free magnetic layer has magnetization perpendicular to a plane (MPP) characteristics when the free magnetic layer has a thickness less than a critical thickness,
   wherein the free magnetic layer has in-plane magnetization (IPM) characteristics when the free magnetic layer has a thickness exceeding the critical thickness, and
   wherein the critical thickness ranges from about 0.5 nm to about 1.5 nm.

\* \* \* \* \*